(12) United States Patent
Imanaka

(10) Patent No.: US 11,193,986 B2
(45) Date of Patent: Dec. 7, 2021

(54) FAILURE DIAGNOSTIC DEVICE

(71) Applicant: GS Yuasa International Ltd., Kyoto (JP)

(72) Inventor: Yuki Imanaka, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 19 days.

(21) Appl. No.: 16/624,173

(22) PCT Filed: Jun. 18, 2018

(86) PCT No.: PCT/JP2018/023110
§ 371 (c)(1),
(2) Date: Dec. 18, 2019

(87) PCT Pub. No.: WO2018/235774
PCT Pub. Date: Dec. 27, 2018

(65) Prior Publication Data
US 2020/0174076 A1 Jun. 4, 2020

(30) Foreign Application Priority Data
Jun. 20, 2017 (JP) .............................. JP2017-120523

(51) Int. Cl.
*G01R 31/327* (2006.01)
*H01M 10/42* (2006.01)
(Continued)

(52) U.S. Cl.
CPC ......... *G01R 31/52* (2020.01); *G01R 31/3277* (2013.01); *G01R 31/3842* (2019.01);
(Continued)

(58) Field of Classification Search
CPC ........ G01R 31/52; G01R 31/50; G01R 31/54; G01R 31/3842; G01R 31/3277;
(Continued)

(56) References Cited

U.S. PATENT DOCUMENTS 9,018,956 B2 4/2015 Eguchi et al.
2007/0188138 A1* 8/2007 Kobayashi ............ H02J 7/0063
320/119

(Continued)

FOREIGN PATENT DOCUMENTS

| CN | 101207296 A | 6/2008 |
| CN | 104471417 A | 3/2015 |

(Continued)

OTHER PUBLICATIONS

International Searching Authority, International Search Report and Written Opinion for International Application No. PCT/JP2018/023110, dated Sep. 11, 2018, (9 pages), Tokyo, Japan.

*Primary Examiner* — Daniel R Miller
(74) *Attorney, Agent, or Firm* — Alston & Bird LLP

(57) ABSTRACT

The present invention addresses the problem of diagnosing a failure of a discharge resistor, while suppressing deterioration of discharge capacity. Disclosed is a failure diagnostic device for a discharge circuit 60 for discharging electricity from an electricity storage element 31. The discharge circuit 60 includes a resistance circuit 61 comprising a plurality of resistor blocks B connected in parallel, and each of the resistor blocks B comprises a plurality of discharge resistors Ra, Rb connected in series. During the time when electricity is being discharged from the electricity storage element 31, the failure diagnostic device diagnosis a failure of the resistance circuit 61 on the basis of a voltage or a current at a connection point P between the discharge resistors Ra, Rb.

8 Claims, 10 Drawing Sheets

(51) Int. Cl.
*H01M 10/44* (2006.01)
*H01M 10/48* (2006.01)
*H02J 7/00* (2006.01)
*G01R 31/50* (2020.01)
*G01R 31/54* (2020.01)
*G01R 31/56* (2020.01)
*G01R 31/52* (2020.01)
*G01R 31/3842* (2019.01)

(52) U.S. Cl.
CPC ............ *G01R 31/50* (2020.01); *G01R 31/54* (2020.01); *H01M 10/425* (2013.01); *H01M 10/441* (2013.01); *H01M 10/482* (2013.01); *H02J 7/0016* (2013.01); *H02J 7/0029* (2013.01); *G01R 31/56* (2020.01); *H01M 2010/4271* (2013.01)

(58) Field of Classification Search
CPC ... G01R 31/56; G01R 31/396; H01M 10/425; H01M 10/441; H01M 10/482; H01M 2010/4271; H01M 50/20; H01M 2220/20; H02J 7/0016; H02J 7/0029; H02J 2310/40; H02J 7/0047; H02J 7/0014; H02J 7/0021; H02J 7/0019; H02J 7/0018; Y02E 60/10; Y02T 10/70
See application file for complete search history.

(56) References Cited

U.S. PATENT DOCUMENTS

| | | | | |
|---|---|---|---|---|
| 2010/0219688 | A1* | 9/2010 | Shyu | H02J 7/35 307/66 |
| 2012/0133310 | A1* | 5/2012 | Lee | B60L 58/21 318/139 |
| 2012/0176160 | A1 | 7/2012 | Sugimura | |
| 2013/0278218 | A1* | 10/2013 | Onnerud | H02J 7/0016 320/118 |
| 2014/0210415 | A1* | 7/2014 | Ohmori | H01M 10/443 320/118 |
| 2017/0237269 | A1* | 8/2017 | Chang | H02J 7/0021 320/118 |

FOREIGN PATENT DOCUMENTS

| | | | |
|---|---|---|---|
| JP | 2003-289629 A | | 10/2003 |
| JP | 2010-011631 A | | 1/2010 |
| JP | 2011-076778 A | | 4/2011 |
| JP | 2012-147587 A | | 8/2012 |
| JP | 2014-206453 A | | 10/2014 |
| JP | 2014206453 A | * | 10/2014 |
| JP | 2015-033283 A | | 2/2015 |
| JP | 2015-223008 A | | 12/2015 |
| JP | 2016-134948 A | | 7/2016 |
| JP | 2016-152720 A | | 8/2016 |
| JP | 2017-009465 A | | 1/2017 |
| WO | WO 2014/045567 A1 | | 3/2014 |

* cited by examiner

Fig. 6

| Case | State of resistance circuit | | State of transistor | Vin[V] |
|---|---|---|---|---|
| 1 | Both Ra and Rb are normal | | All are turned off | 0 |
| 2 | Ra of discharge block B1 fails | Open circuit failure | Only Q3 is turned on | E/2 |
| 3 | | Short circuit failure | Only Q1 is turned on | E |
| 4 | Rb of discharge block B1 fails | Open circuit failure | Only Q1 is turned on | E |
| 5 | | Short circuit failure | Only Q3 is turned on | E/2 |

Fig. 8

| Case | Operation of each transistor | | State of Q4 | Vin[V] |
|---|---|---|---|---|
| | Q4 | Q5 | | |
| 1 | Off | On | Normal | E |
| 2 | | | Short circuit failure | E/2 |
| 3 | On | On | Normal | E/2 |
| 4 | | | Open circuit failure | E |

FAILURE DIAGNOSTIC DEVICE

CROSS REFERENCE TO RELATED APPLICATIONS

This application is a national stage application, filed under 35 U.S.C. § 371, of International Application No. PCT/JP2018/023110, filed Jun. 18, 2018, which claims priority to Japanese Application No. 2017-120523, filed Jun. 20, 2017, the contents of both of which as are hereby incorporated by reference in their entirety.

BACKGROUND

Technical Field

The present invention relates to a technique of detecting failure of a discharge resistor.

Description of Related Art

A battery in which secondary batteries are connected in series has a balancer function in order to equalize a remaining capacity between the secondary batteries. Generally, resistance of a balancer circuit has a configuration in which a plurality of discharge resistors are connected in series and parallel due to heat dissipation and power rating. In the balancer circuit, when the discharge resistor fails in a short circuit mode, a power loss increases at a resistor connected in series with the short-circuited resistor. For this reason, when the balancer circuit is operated in a short-circuited state, sometimes the failure is generated due to heat generation. When the discharge resistor fails in an open circuit mode, a discharge capacity of the balancer circuit decreases, which results in a problem in that voltages of the secondary batteries cannot be balanced.

In WO 2014/045567, resistance voltage-dividing circuits 4A, 4B are provided in parallel with a discharge resistor 11A, and the failures of discharge resistors 11A, 11B are determined by comparing the voltage for turn-on of a switch 12 to the voltage for turn-off of the switch 12.

BRIEF SUMMARY

In a method of WO 2014/045567, because a switch is turned off in detecting the failure, discharge is temporarily stopped. For this reason, a usable period of a discharge circuit is restricted, which results in lowering of the discharge capacity.

The present invention has been completed based on the above circumstances, and an object of the present invention is to diagnose the failure of the discharge resistor while the lowering of the discharge capacity is prevented.

According to one aspect of the present invention, a failure diagnostic device is used for a discharge circuit that discharges an energy storage device. The discharge circuit includes a resistance circuit including a plurality of resistance blocks connected in parallel, each of the resistance blocks includes a plurality of discharge resistors connected in series, and during discharge of the energy storage device, the failure diagnostic device diagnoses failure of the resistance circuit based on voltage or current at a connection point of the discharge resistor.

In this configuration, the failure of the resistance circuit can be detected during the operation of the discharge circuit. Consequently, it is not necessary to stop the discharge circuit even in detecting the failure, so that the lowering of the discharge capacity due to the discharge circuit can be prevented.

BRIEF DESCRIPTION OF THE FIGURES

FIG. 6 is a table in which voltage input to a BM is summarized for each state of discharge resistance.

FIG. 8 is a table in which summarizes voltage Vin input to the BM is summarized for each state of a transistor Q4.

DETAILED DESCRIPTION OF VARIOUS EMBODIMENTS

Figure 1:
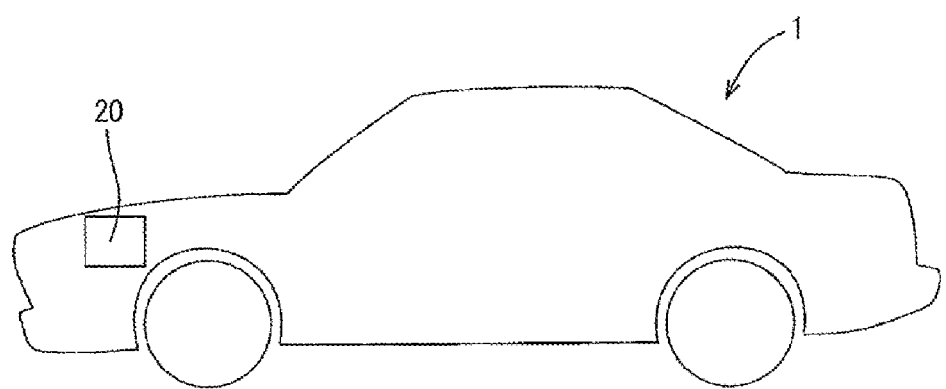
FIG. 1 is a side view illustrating an automobile according to a first embodiment.

According to one aspect of the present invention, a failure diagnostic device is used for a discharge circuit that discharges an energy storage device. The discharge circuit includes a resistance circuit including a plurality of resistance blocks connected in parallel, each of the resistance blocks includes a plurality of discharge resistors connected in series, and during discharge of the energy storage device, the failure diagnostic device diagnoses failure of the resistance circuit based on voltage and current at a connection point of the discharge resistor. With this configuration, the failure of the resistance circuit can be diagnosed during the operation of the discharge circuit. For this reason, it is not necessary to stop the discharge circuit for the purpose of the failure diagnosis, so that the lowering of the discharge capacity due to the discharge circuit can be prevented.

The failure diagnostic device may include: a detection element that detects a voltage difference between resistance blocks at the connection point of the discharge resistors and outputs a detection signal; and a determination unit that determines whether the resistance circuit fails based on the detection signal output from the detection element. With this configuration, the determination unit can diagnose the failure of the resistance circuit by monitoring only the presence or absence of the detection signal output from the detection element. For this reason, it is not necessary for the determination unit to have an advanced calculation function, and the failure diagnosis of the resistance circuit can be performed with an inexpensive configuration.

The failure diagnostic device may include a plurality of the detection elements corresponding to the plurality of resistance blocks. The plurality of detection elements are commonly connected to the determination unit. With this configuration, the circuit configuration is simple because only one detection line is required to connect the determination unit and each detection element. Additionally, the determination unit only needs to monitor one input when determining whether the resistance circuit fails, and a monitoring burden is small.

The detection element may be an optical insulation element that transmits the detection signal to the determination unit while being insulated from the resistance circuit. With this configuration, the determination unit can be protected from overvoltage. Additionally, because the failure is hardly generated in the determination unit, the failure diagnosis of the resistance circuit has high reliability.

The energy storage device may be a battery of a 48-V system. The battery of the 48-V system has the voltage four times that of a 12-V battery, and the determination unit fails easily. By applying the present technique, the determination unit can effectively be protected from overvoltage, and the failure is hardly generated in the determination unit. Consequently, the failure diagnosis of the resistance circuit has the high reliability.

The discharge circuit may include a series switch connected in series to the resistance circuit, and the determination unit may determine whether the series switch fails based on the voltage at the connection point of the discharge resistor. With this configuration, not only the failure of the resistance circuit but also the failure of the series switch can be detected.

A plurality of the energy storage devices may be provided in series, and the discharge circuit may be a balancer circuit that is provided corresponding to each of the plurality of energy storage devices to equalize the voltages of the plurality of energy storage devices. With this configuration, it is not necessary to stop the discharge circuit for the purpose of the failure diagnosis, a balancing capacity of the balancer circuit (discharge circuit) is increased.

First Embodiment

1. Battery

Figure 2:
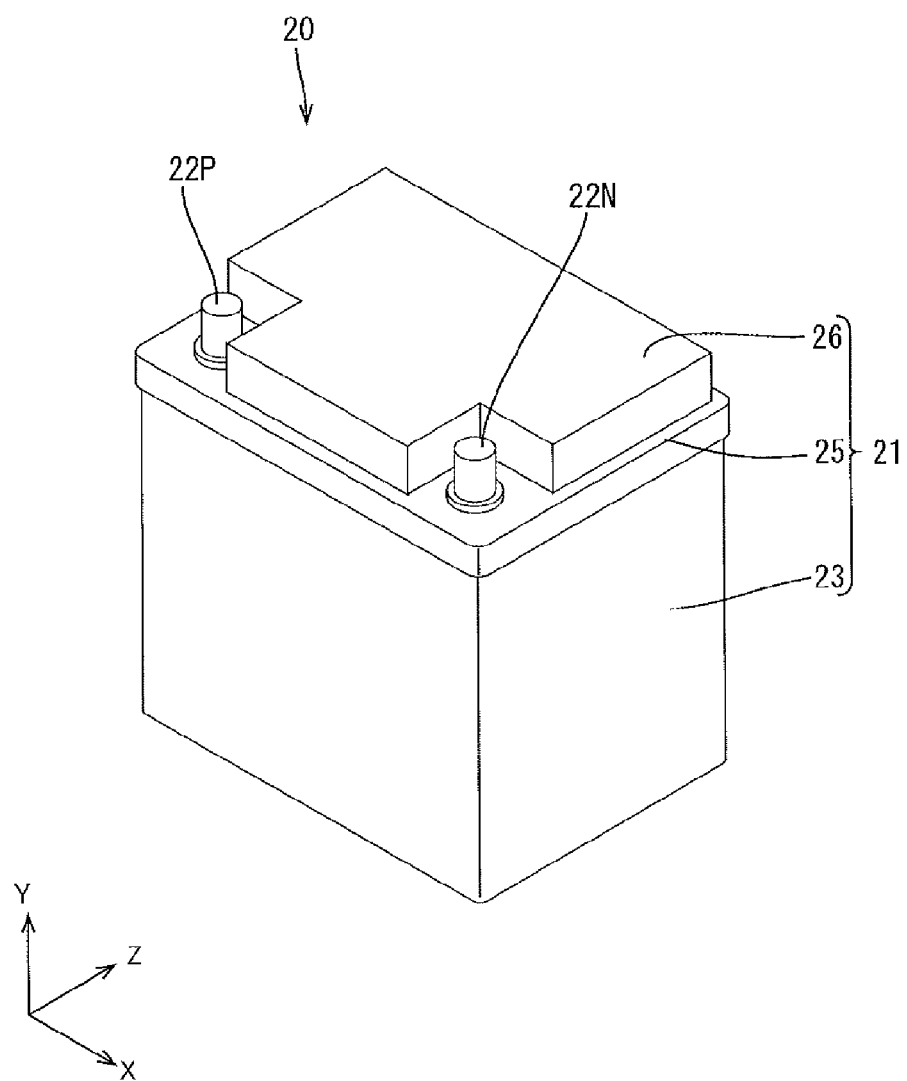
FIG. 2 is a perspective view of a battery
Figure 3:
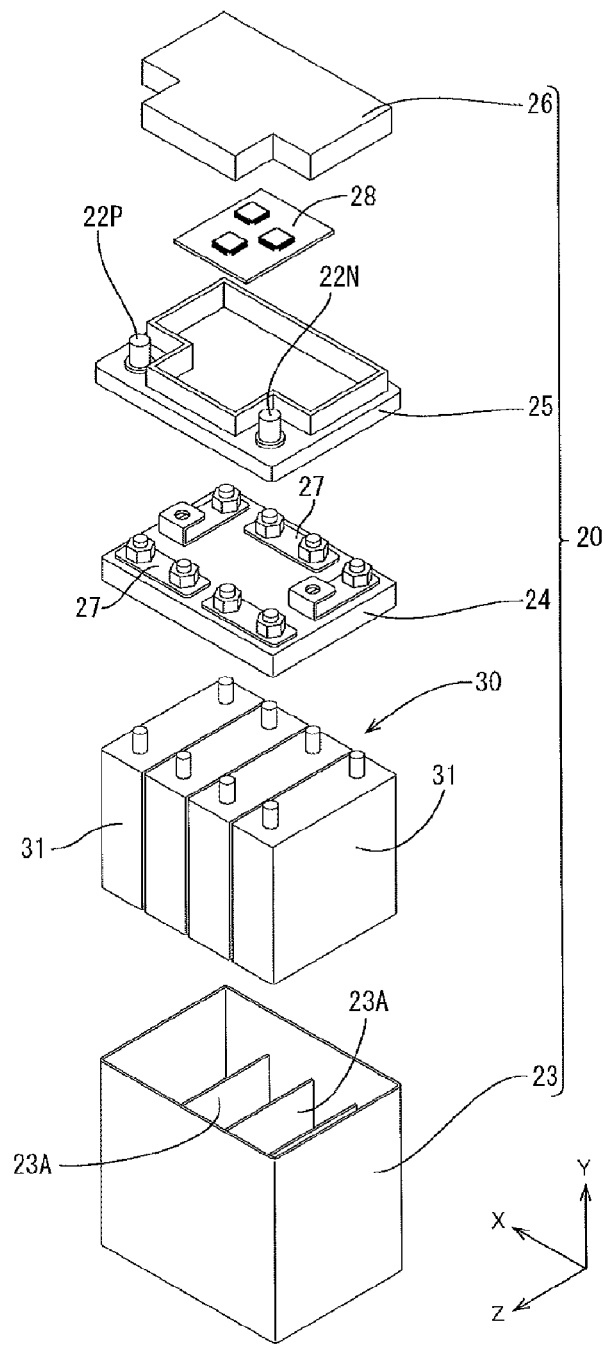
FIG. 3 is an exploded perspective view of the battery
Figure 4:
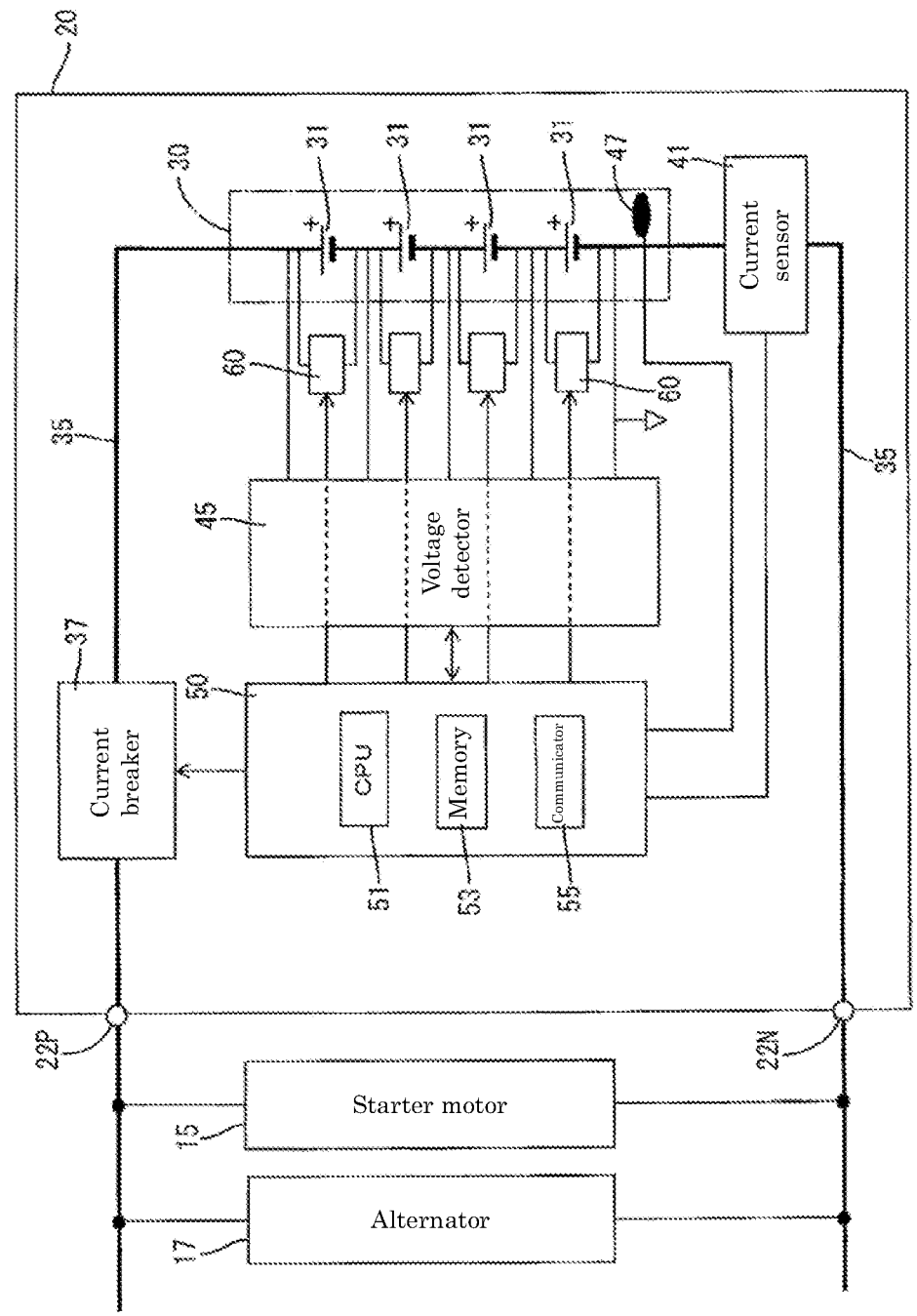
FIG. 4 is a block diagram illustrating the electric configuration of the battery.

FIG. 1 is a side view of an automobile, FIG. 2 is a perspective view of a battery, FIG. 3 is an exploded perspective view of the battery, and FIG. 4 is a block diagram illustrating an electrical configuration of the battery.

An automobile 1 includes a battery (energy storage apparatus) 20 as illustrated in FIG. 1. As illustrated in FIG. 2, the battery 20 includes a battery case 21 having a block shape, and an assembled battery 30 including a plurality of secondary batteries 31 and a control board 28 are accommodated in the battery case 21. In the following description, in the case where FIGS. 2 and 3 are referred to, when the battery case 21 is placed horizontally without being inclined with respect to an installation surface, a vertical direction of the battery case 21 is set to a Y-direction, and s long-side direction of the battery case 21 is set to an X-direction, and a depth direction of the battery case 21 is set to a Z-direction.

As illustrated in FIG. 3, the battery case 21 includes a case body 23 having a box shape and open upward, a positioning member 24 that positions the plurality of secondary batteries 31, and an inner lid 25 attached to the top of the case body 23, and an upper lid 26 attached to the top of the inner lid 25. In the case body 23, as illustrated in FIG. 3, a plurality of cell chambers 23A in each of which the secondary battery 31 is individually accommodated are provided side by side in the X-direction.

As illustrated in FIG. 3, a plurality of bus bars 27 are disposed on the top surface of the positioning member 24, and the positioning member 24 is disposed on the tops of the plurality of secondary batteries 31 disposed in the case body 23, whereby the plurality of secondary batteries 31 are positioned and connected in series by the plurality of bus bars 27.

As illustrated in FIG. 2, the inner lid 25 has a substantially rectangular shape in planar view, and has a shape with a height difference in the Y-direction. A pair of terminal portions 22P, 22N to which harness terminals (not illustrated) are connected are provided at both ends in the X-direction of the inner lid 25. For example, the pair of terminal portions 22P, 22N are made of metal such as a lead alloy. The reference numeral 22P designates a positive electrode-side terminal, and the reference numeral 22N designates a negative electrode-side terminal.

As illustrated in FIG. 3, the control board 28 is accommodated in the inner lid 25, and the secondary battery 31 and the control board 28 are connected to each other by attaching the inner lid 25 to the case body 23.

An electric configuration of the battery 20 will be described with reference to FIG. 4. The battery 20 includes the assembled battery 30, a current sensor 41, a current breaker 37, and a battery management device (hereinafter referred to as BM) 50 that manages the assembled battery 30.

An electric configuration of the battery 20 will be described with reference to FIG. 4. The battery 20 includes the assembled battery 30, a current breaker 37, a current sensor 41, a voltage detector 45, a temperature sensor 47, a discharge circuit 60, and a battery management device (hereinafter referred to as BM) 50 that manages the assembled battery 30.

The assembled battery 30 includes the plurality of secondary batteries (for example, lithium ion secondary batteries) 31 connected in series. The assembled battery 30, the current sensor 41, and the current breaker 37 are connected in series through a current-carrying path 35. The current sensor 41 is disposed on the negative electrode side, and the current breaker 37 is disposed on the positive electrode side. The current sensor 41 is connected to the negative electrode-side terminal 22N, and the current breaker 37 is connected to the positive electrode-side terminal 22P.

The secondary battery 31 has a battery voltage E of about 3.5 [V], the assembled battery 30 has a total voltage of about 14 V, and a voltage class of the battery 20 is a 12-V system. The battery 20 is used to start an engine. As illustrated in FIG. 4, the battery 20 is connected to a starter motor 15 that starts the engine mounted on the automobile 1, and the starter motor 15 is driven by power supplied from the battery 20. In addition to the starter motor 15, a vehicle load (not illustrated) such as an electrical component and an alternator 17 are connected to the battery 20. When an amount of power generated by the alternator 17 is greater than the power consumption of the vehicle load, the battery 20 is charged by the alternator 17. Further, when the amount of power generated by the alternator 17 is smaller than the power consumption of the vehicle load, the battery 20 is discharged to compensate for shortage.

The current sensor 41 is provided in the battery case 21, and detects current flowing through the secondary battery 31. The current sensor 41 is electrically connected to the BM 50 through a signal line, and output of the current sensor 41 is taken in the BM 50.

The voltage detector 45 is provided in the battery case 21, and detects the voltage of each secondary battery 31 and the total voltage of the assembled battery 30. The voltage detector 45 is electrically connected to the BM 50 through a signal line, and output of the voltage detector 45 is taken in the BM 50.

The temperature sensor 47 is provided in the battery case 21, and detects a temperature of the secondary battery 31. The temperature sensor 47 is electrically connected to the BM 50 through a signal line, and output of the temperature sensor 47 is taken in the BM 50.

The current breaker 37 can be constructed with a contact switch (mechanical type) such as a relay or a semiconductor switch such as an FET or a transistor. The current breaker 37 is disposed on the current-carrying path 35 of the assembled battery 30, and opens and closes the current-carrying path 35 of the secondary battery 31.

The BM 50 includes a CPU 51 having a calculation function, a memory 53 in which various pieces of information are stored, and communicator 55, and is provided on the control board 28. The communicator 55 is connected to a vehicle electronic control unit (ECU) mounted on the automobile 1, and the BM 50 can receive vehicle information such as an engine operating state from the vehicle ECU 100.

The BM 50 monitors the current of the secondary battery 31 based on the output of the current sensor 41. The voltage of each secondary battery 31 and the total voltage of the assembled battery 30 are monitored based on the output of the voltage detector 45. The temperature of the secondary battery 31 is monitored based on the output of the temperature sensor 47.

When the voltage, current, and temperature of the secondary battery 31 are abnormal, the BM 50 sends a command to the current breaker 37 to protect the battery 20 by breaking the current.

The BM 50 estimates a state of charge (SOC) of the battery 20 based on an integral value of current I detected by the current sensor 41 to time as indicated by the following equation (2). A sign of the current is set to positive during charge and set to negative during discharge. An equation (1) shows a definition of the SOC.

$$SOC = Cr/Co \times 100 \tag{1}$$

where Co is a full charge capacity of the secondary battery, and Cr is a remaining capacity of the secondary battery.

$$SOC = SOCo + 100 \times \int I dt / Co \tag{2}$$

where SOCo is an initial value of SOC, and I is the current.

2. Discharge Circuit 60 and Failure Diagnosis

Figure 5:
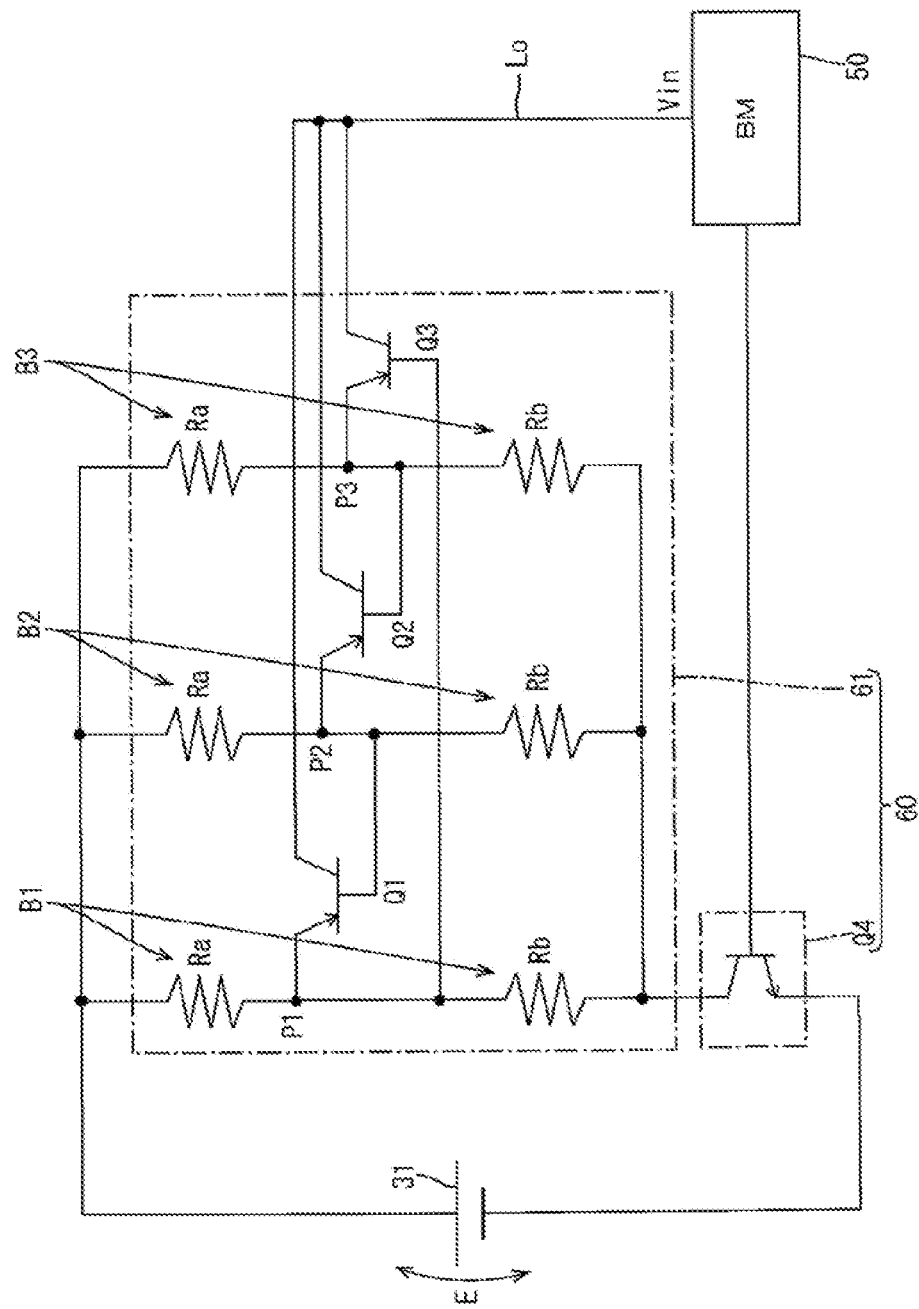
FIG. 5 is a circuit diagram of a discharge circuit

The discharge circuit 60 is individually provided for each secondary battery 31. As illustrated in FIG. 5, the discharge circuit 60 includes a resistance circuit 61 and a fourth transistor Q4.

The resistance circuit 61 includes a plurality of resistance blocks B1 to B3 connected in parallel. In FIG. 5, three resistance blocks B1 to B3 are connected in parallel. Each of the resistance blocks B1 to B3 includes two series-connected discharge resistors Ra, Rb. Resistance values of the two discharge resistors Ra, Rb are equal to each other.

The reason why the resistance circuit 61 is constructed with the plurality of resistors Ra, Rb connected in series and parallel is to increase a discharge capacity of the resistance circuit 61.

The fourth transistor Q4 is an NPN transistor. In the fourth transistor Q4, a collector is connected to the resistance circuit 61, and an emitter is connected to the negative electrode of the secondary battery 31. A base of the fourth transistor Q4 is connected to the BM50 through the signal line.

When an operation signal is given to the base of the fourth transistor Q4 to turn on the fourth transistor Q4, the current flows through the resistance circuit 61, and the secondary battery 31 can be discharged. The fourth transistor Q4 is an example of the "series switch" of the present invention.

The BM 50 monitors the voltage of each secondary battery 31 constituting the assembled battery 30 based on the output of the voltage detector 45. When a voltage difference between the secondary batteries 31 (for example, a difference between the highest voltage and the lowest voltage) exceeds a threshold, the secondary battery 31 having the higher voltage is discharged using the discharge circuit 60, thereby equalizing the voltage of the secondary battery 31 constituting the assembled battery 30. Thus, the discharge circuit 60 is a balancer circuit that equalizes the voltage of the secondary battery 31.

As illustrated in FIG. 5, the battery 20 includes three transistors Q1 to Q3 corresponding to the three resistance blocks B1 to B3. The first transistor Q1 is a PNP transistor, the emitter of the first transistor Q1 is connected to a connection point P1 of the two discharge resistors Ra, Rb of the resistance block B1, and the base of the first transistor Q1 is connected to a connection point P2 of the two discharge resistors Ra, Rb of the resistance block B2.

The second transistor Q2 is a PNP transistor, the emitter of the second transistor Q2 is connected to the connection point P2 of the two discharge resistors Ra, Rb of the resistance block B2, and the base of the second transistor Q2 is connected to a connection point P3 of the two discharge resistors Ra, Rb of the resistance block B3. The third transistor Q3 is a PNP transistor, the emitter of the third transistor Q3 is connected to the connection point P3 of the two discharge resistors Ra, Rb of the resistance block B3, and the base of the third transistor Q3 is connected to the connection point P1 of the two discharge resistors Ra, Rb of the resistance block B1.

The collector of the first transistor Q1, the collector of the second transistor Q2, and the collector of the third transistor Q3 are commonly connected to a detection line Lo.

The first transistor Q1 to the third transistor Q3 are turned on when the voltage difference between the emitter and the base becomes higher than an operation voltage (for example, 0.6 V). The first transistor Q1 to the third transistor Q3 are examples of the "detection element" of the present invention.

The BM 50 diagnoses the failure of the resistance circuit 61 by monitoring an input voltage Vin from the detection line Lo during the discharge of the secondary battery 31 by the resistance circuit 61. The BM 50 is an example of the "determination unit" of the present invention.

A method for diagnosing the failure of the resistance circuit 61 will specifically be described below.

When the fourth transistor Q4 is turned on, a discharge current flows from the secondary battery 31 to the resistance circuit 61. Assuming that voltage at the secondary battery 31 is E [V], all the voltages at the connection points P1 to P3 of the resistance blocks B1 to B3 become E/2 [V] when the discharge circuit 61 is normal.

For this reason, as illustrated in FIG. 6, all the transistors Q1 to Q3 are turned off, and the voltage Vin input to the BM 50 becomes zero [V].

When the discharge resistor Ra of the resistance block B1 has an open circuit failure due to disconnection or the like, the voltage at the connection point P1 of the resistance block B1 becomes 0 [V], and the voltages at the connection points P2, P3 of the resistance blocks B2, B3 become E/2 [V]. Consequently, a positive voltage difference higher than the operation voltage of the transistor Q is generated between the emitter and base of the third transistor Q3. For this reason, among the transistors Q1 to Q3, the third transistor Q3 is turned on, and the voltage Vin input to the BM 50 becomes E/2 [V]. That is, the detection signal of E/2 [V] is input from the third transistor Q3 to the BM 50.

When the discharge resistor Ra of the resistance block B1 has a short circuit failure, the voltage at the connection point P1 of the resistance block B1 becomes E [V], and the voltages at the connection points P2, P3 of the resistance blocks B2, B3 become E/2 [V]. Consequently, a positive voltage difference higher than the operation voltage of the transistor Q is generated between the emitter and base of the first transistor Q1. For this reason, among the transistors Q1 to Q3, the first transistor Q1 is turned on, and the voltage Vin input to the BM 50 becomes E [V]. That is, the detection signal of E [V] is input from the first transistor Q1 to the BM 50.

When the discharge resistor Rb of the resistance block B1 has the open circuit failure due to disconnection or the like, the voltage at the connection point P1 of the resistance block B1 becomes E [V], and the voltages at the connection points P2, P3 of the resistance blocks B2, B3 become E/2 [V]. Consequently, a positive voltage difference higher than the operation voltage of the transistor Q is generated between the emitter and base of the first transistor Q1. For this reason, among the transistors Q1 to Q3, the first transistor Q1 is turned on, and the voltage Vin input to the BM 50 becomes E [V]. That is, the detection signal of E [V] is input from the first transistor Q1 to the BM 50.

When the discharge resistor Rb of the resistance block B1 has the short circuit failure, the voltage at the connection point P1 of the resistance block B1 becomes 0 [V], and the voltages at the connection points P2, P3 of the resistance blocks B2, B3 become E/2 [V]. Consequently, a positive voltage difference higher than the operation voltage of the transistor Q is generated between the emitter and base of the third transistor Q3. For this reason, among the transistors Q1 to Q3, the third transistor Q3 is turned on, and the voltage Vin input to the BM 50 becomes E/2 [V]. That is, the detection signal of E/2 [V] is input from the third transistor Q3 to the BM 50.

When either of the discharge resistors Ra or Rb of the resistance block B2 fails, either the first transistor Q1 or the second transistor Q2 is turned on, and the voltage Vin input to the BM 50 becomes E [V] or E/2 [V]. That is, the detection signal of E [V] or E/2 [V] is input to the BM 50 from either the first transistor Q1 or the second transistor Q2.

When either of the discharge resistors Ra or Rb of the resistance block B3 fails, either the second transistor Q2 or the third transistor Q3 is turned on, and the voltage Vin input to the BM 50 becomes E [V] or E/2 [V]. That is, the detection signal of E [V] or E/2 [V] is input to the BM 50 from either the second transistor Q2 or the third transistor Q3.

From the above, the BM 50 can diagnose the failures of the discharge resistors Ra, Rb by monitoring the input voltage Vin during the discharge of the secondary battery 61 by the discharge circuit 60.

Specifically, a determination that the resistance circuit 61 is normal, namely, a determination that all the discharge resistors Ra, Rb constituting the resistance circuit 61 are normal can be made when the input voltage Vin is zero [V]. On the other hand, the determination that the resistance circuit 61 fails can be made when the input voltage Vin is E [V] or E/2 [V]. That is, the determination that one of the discharge resistors Ra, Rb of each of the discharge blocks B1 to B3 constituting the resistance circuit 61 fails can be made.

In the configuration of the first embodiment, the BM 50 diagnoses the failure of the resistance circuit 61 based on the detection signal (an H-level voltage signal of E [V] or E/2 [V]) output from the first transistor Q1 to the third transistor Q3. The three transistors Q1 to Q3 and the BM 50 constitute a failure diagnostic device that performs a failure diagnosis of the resistance circuit 61.

3. Effect

In the configuration of the first embodiment, the failure of the resistance circuit 61 can be diagnosed during the operation of the discharge circuit 60. For this reason, it is not necessary to stop the discharge circuit 60 even in the failure diagnosis, so that the lowering of the discharge capacity due to the discharge circuit 60 can be prevented.

In the configuration of the first embodiment, the BM 50 can diagnose the failure of the discharge circuit 61 by monitoring only the input voltage Vin. For this reason, it is not necessary for the BM 50 to have an advanced calculation function, and the failure diagnosis of the resistance circuit 61 can be performed with an inexpensive configuration.

In the configuration of the first embodiment, the circuit configuration is simple because of only one detection line Lo connecting the BM 50 and each of the transistors Q1 to Q3. The BM 50 only needs to monitor one input voltage Vin when determining whether the resistance circuit 61 fails, and a monitoring burden is small.

Because the discharge circuit 60 has the high discharge capacity in the configuration of the first embodiment, the configuration of the first embodiment is an preferable way to use the battery 20 in the state in which the charge is performed by a relatively high current to easily become overcharge like the charge using a quick charger. That is, because the discharge circuit 60 has the high discharge capacity, the voltage at the secondary battery 31 can be reduced in a short time, and the overcharge of the secondary battery 31 can be prevented.

Second Embodiment

Figure 7:
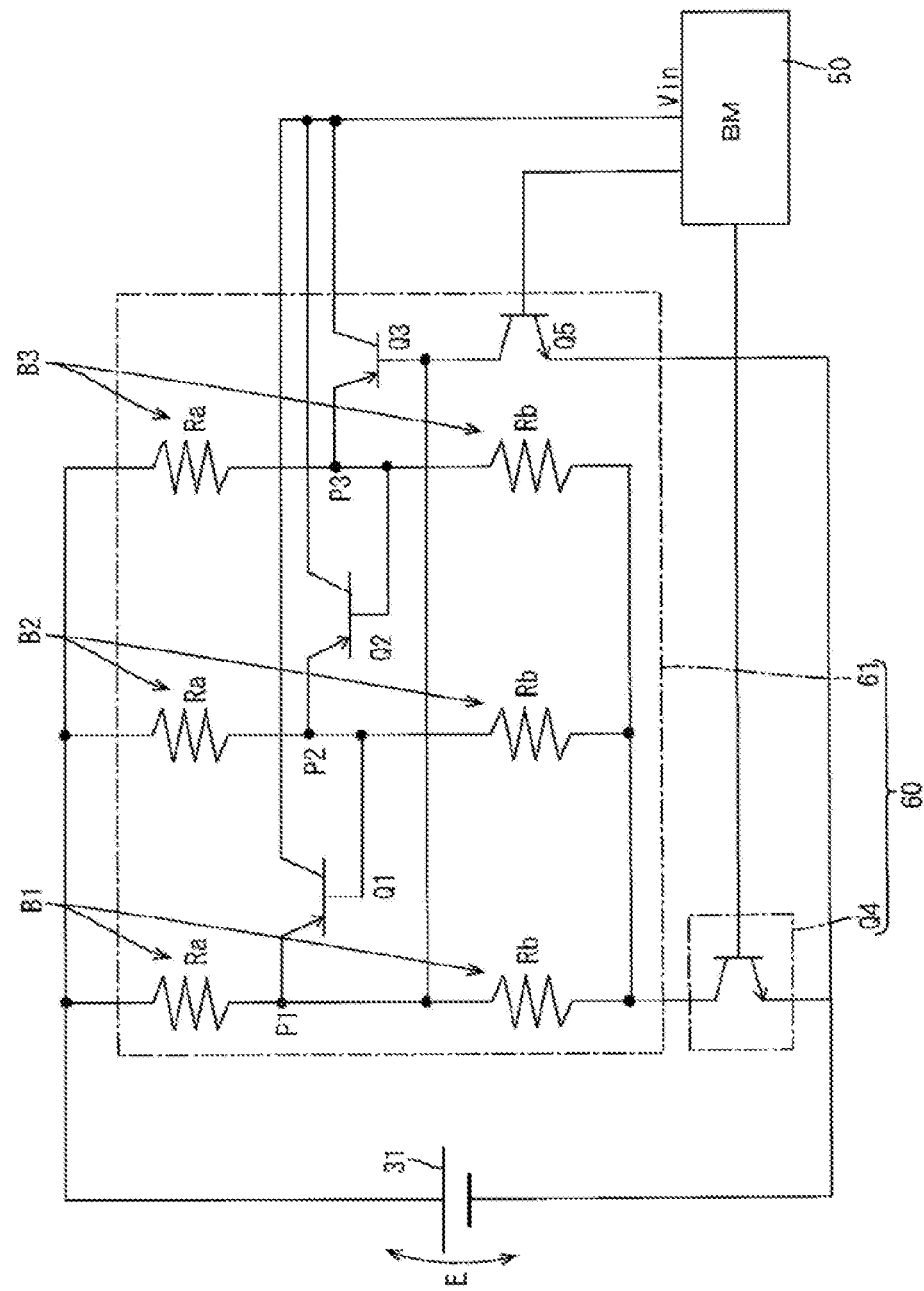
FIG. 7 is a circuit diagram of a discharge circuit according to a second embodiment.

As illustrated in FIG. 7, a second embodiment has a configuration in which a fifth transistor Q5 is added to the circuit configuration of the first embodiment. The fifth transistor Q5 is provided for each resistance circuit 61. The fifth transistor Q5 is an NPN transistor, the emitter of the fifth transistor Q5 is connected to the negative electrode of the secondary battery 31, and the collector of the fifth transistor Q5 is connected to the base of the third transistor Q3. The base of the fifth transistor Q5 is connected to the BM 50 through the signal line.

When the operation signal is input from the BM 50 to the base of the fifth transistor Q5, the fifth transistor Q5 is turned on, and the base voltage of the third transistor Q3 is lowered. Consequently, the third transistor Q3 is switched from off to on, so that the voltage at the connection point P3 of the resistance block B3 is input to the BM 50 through the third transistor Q3.

The BM 50 determines whether the fourth transistor Q4 fails based on the voltage at the connection point P3 when the fourth transistor Q4 is turned on and off. Specifically, in the case where the BM 50 gives an off operation signal to the fourth transistor Q4 while giving an on operation signal to the fifth transistor Q5, the voltage Vin input to the BM 50 becomes E [V] when the fourth transistor Q4 is normally operated (when turned off) as illustrated in FIG. 8. On the other hand, when the fourth transistor Q4 has the short circuit failure, the voltage Vin input to the BM 50 becomes E/2 [V]. Thus, the BM 50 can determine the short circuit failure of the fourth transistor Q4 from the value of the input voltage Vin.

In the case where the BM 50 gives the on operation signal to the fourth transistor Q4 while giving the off operation signal to the fifth transistor Q5, the voltage Vin input to the BM 50 becomes E/2 [V] when the fourth transistor Q4 is normally operated (when turned on) as illustrated in FIG. 8. On the other hand, when the fourth transistor Q4 has the open circuit failure, the voltage Vin input to the BM 50 becomes E [V]. Thus, the BM 50 can determine the open circuit failure of the fourth transistor Q4 from the value of the input voltage Vin.

In the third embodiment, not only the failure of the resistance circuit 61 but also the failure of the fourth transistor Q4 that is a series switch can be determined.

Third Embodiment

The battery 20 of the first embodiment is used to start the engine, and the voltage class of the battery 20 is a 12-V system. The battery 20 according to a third embodiment is used to drive an electric component such as an electric air conditioner and a power steering, and has the voltage class of 48-V system (the total voltage of the assembled battery is about 48 V).

Figure 9:
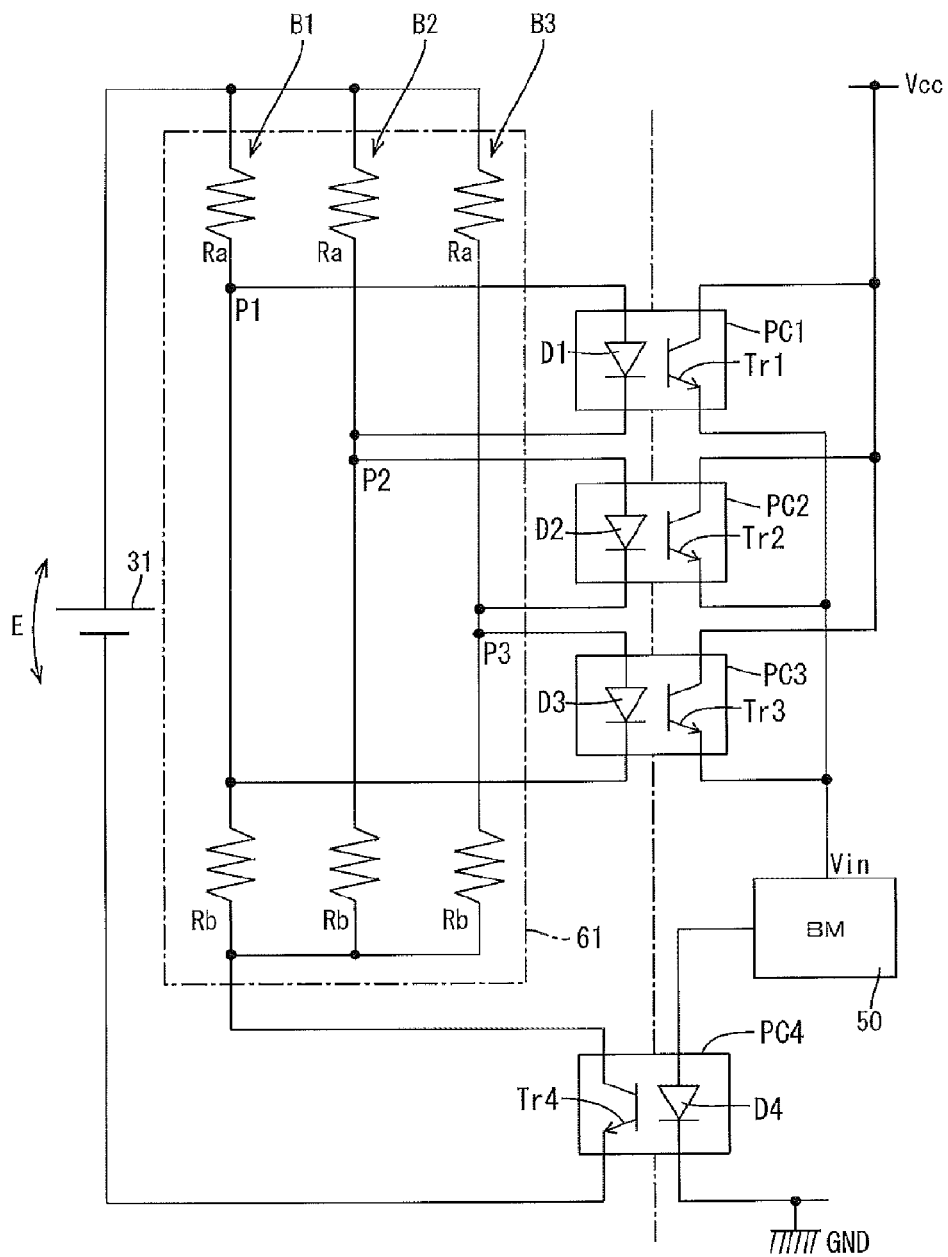
FIG. 9 is a circuit diagram of a discharge circuit according to a third embodiment.

In the third embodiment, as illustrated in FIG. 9, the first transistor Q1 to the fourth transistor Q4 are replaced with a first photocoupler PC1 to a fourth photocoupler PC4 with respect to the circuit configuration of the first embodiment. The first photocoupler PC1 to the fourth photocoupler PC4 are examples of the "optical insulation element" of the present invention.

The photocouplers PC1 to PC3 include light emitting diodes D1 to D3 and phototransistors Tr1 to Tr3. Each of the light emitting diodes D1 to D3 is connected between two of the connection points P1 to P3. In each of the phototransistors Tr1 to Tr3, the collector is commonly connected to a power supply Vcc and the emitter is commonly connected to the BM 50.

The photocoupler PC4 includes a light emitting diode D4 and a phototransistor Tr4. In the light emitting diode D4, an anode is connected to the BM 50 and a cathode is connected to the ground. In the phototransistor Tr4, the collector is connected to the resistance circuit 61 and the emitter is connected to the negative electrode of the secondary battery 31. When the operation signal is input from the BM 50 to the light emitting diode D4, the photocoupler PC4 is turned on, so that the current flows through the discharge circuit 61 to discharge the secondary battery 31.

During the discharge of the secondary battery 31 by the resistance circuit 61, when the discharge resistors Ra, Rb of each of the resistance blocks B1 to B3 do not fail, the voltages at the connection points P1 to P3 are equal to E/2 [V]. For this reason, all the photocouplers PC1 to PC3 are turned off, and the input voltage Vin of the BM 50 becomes zero [V].

On the other hand, when the discharge resistors Ra, Rb of one of the resistance blocks B1 to B3 fail, one of the photocouplers PC1 to PC3 is turned on, and the input voltage Vin of the BM 50 becomes Vcc [V]. For example, when the discharge resistor Rb of the resistance block B1 has the open circuit failure, the voltage difference between the connection point P1 and the connection point P2 becomes E/2 [V]. Consequently, because the photocoupler PC1 is turned on, the input voltage Vin of BM 50 becomes Vcc [V].

From the above, the BM 50 can diagnose the failures of the discharge resistors Ra, Rb by monitoring the input voltage Vin during the discharge of the secondary battery 31 by the resistance circuit 61 similarly to the first embodiment.

In the third embodiment, the first transistor Q1 to the fourth transistor Q4 are replaced with the first photocoupler PC1 to the fourth photocoupler PC4. For this reason, the BM 50 can be insulated from the high voltage-side circuit such as the secondary battery 31 and the resistance circuit 61. Thus, the BM 50 can be protected from overvoltage. The failure is hardly generated in the BM 50, the failure diagnosis of the resistance circuit 61 is highly reliable, and the balancer capacity by the discharge circuit 60 can be maintained.

Other Embodiments

The present invention is not limited to the embodiments described with reference to the above description and the drawings. For example, the following embodiments are also included in the technical scope of the present invention.

(1) In the first to third embodiments, the secondary battery is illustrated as an example of the energy storage device. The energy storage device is not limited to the secondary battery, but may be an electric double layer capacitor or the like. The use of the battery 20 is not limited to the vehicle, but may be other uses such as a UPS and an energy storage unit of a solar power generation system.

(2) In the first to third embodiments, the number of series connections of the discharge resistors Ra, Rb is "2". The number of series connections of the discharge resistors Ra, Rb is not limited to "2", but may be at least "2" such as "3". The number of parallel connections of the resistance blocks B is not limited to "3", but may be "2", "4", or the like. The resistance values of the discharge resistors Ra, Rb are not necessarily the same value. The two discharge resistors R, Rb may have different resistance values as long as a resistance ratio is equal among the resistance blocks B1 to B3.

(3) In the first embodiment, the first transistor Q1 to the third transistor Q3 are used as an example of the detection element. The detection element can be applied as long as an element detects the voltage difference and outputs the detection signal, and a field effect transistor (FET) or the like can be used as the detection element.

(4) In the first embodiment, the failure of the discharge circuit 61 is diagnosed based on the voltage difference between the discharge resistors Ra, Rb at the connection points P1 to P3 of the resistance blocks B1 to B3. Additionally, the failure of the discharge circuit 61 may be diagnosed based on a current difference between the resistance blocks B1 to B3. During the discharge of the secondary battery 31, currents I1 to I3 flowing through the resistance blocks B1 to B3 may be obtained, and the failure of the discharge circuit 61 may be diagnosed from these current differences. The current flowing through each of the resistance blocks B1 to B3 may be measured by providing a dedicated current sensor, or may be calculated from the voltage at each of the connection point P1 to P3 and the value of the discharge resistor Rb.

(5) In the first embodiment, the first transistor Q1 to the third transistor Q3 are provided in order to detect the voltage difference between the discharge resistors Ra, Rb at the connection points P1 to P3 of the resistance blocks B1 to B3. The potential difference may be detected by a method different from that of the first transistor Q1 to the third transistor Q3.

Figure 10:
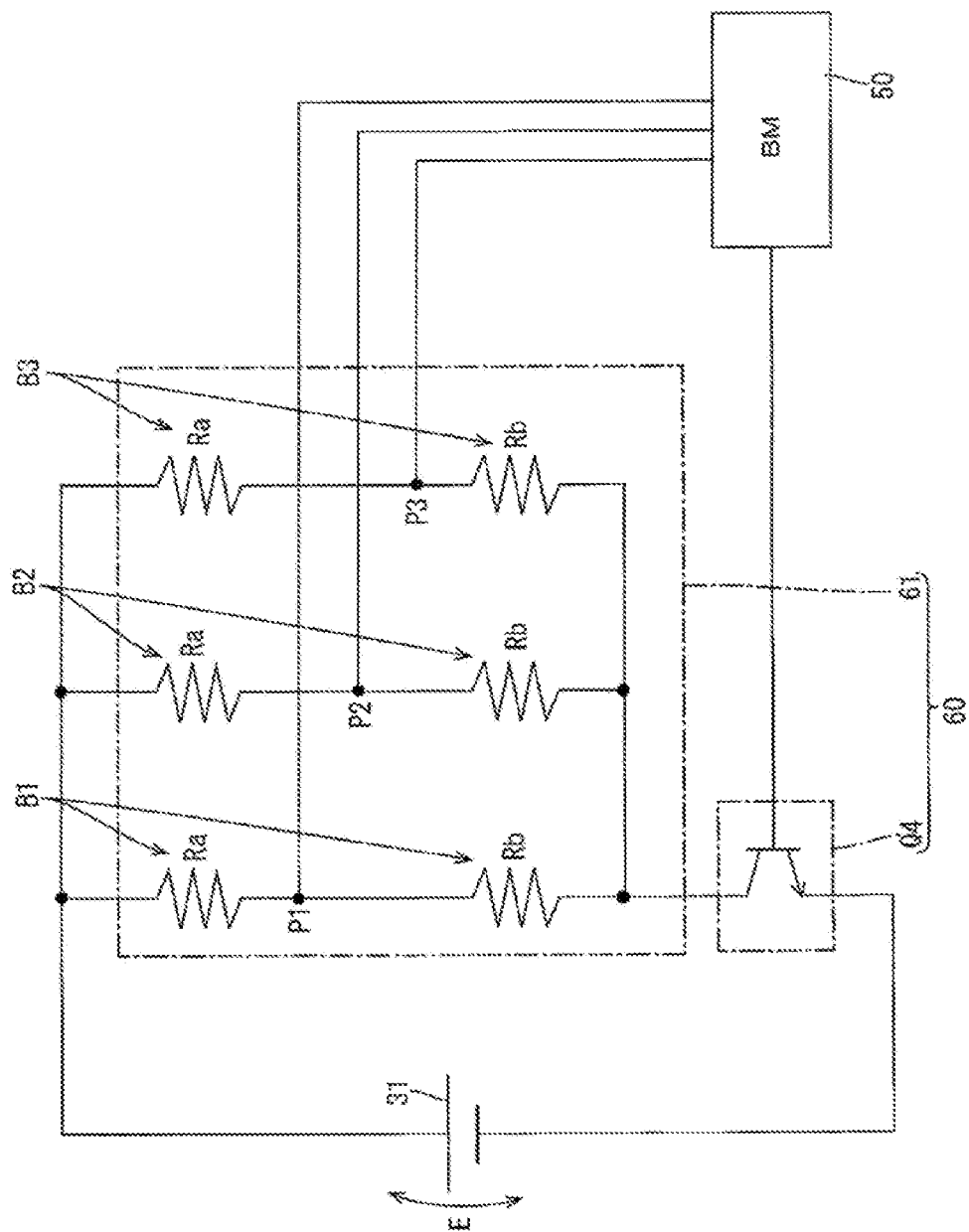
FIG. 10 is a circuit diagram of a discharge circuit according to another embodiment.

For example, as illustrated in FIG. 10, the BM 50 and the connection points P1 to P3 are connected to each other by the signal line, and the voltages at the connection points P1 to P3 of the resistance blocks B1 to B3 are monitored by the BM 50. During the discharge of the secondary battery 31 by the resistance circuit 61, the BM 50 detects the voltage difference at the connection points P1 to P3 between the resistance blocks from the voltages at the connection points P1 to P3. The failure of the discharge circuit 61 is diagnosed based on the detected potential difference. That is, the discharge circuit 61 is determined to be normal when the voltages at the connection points P1 to P3 of the discharge blocks B1 to B3 are equal to one another. On the other hand, the determination that the discharge circuit 61 fails is made when the voltage difference greater than or equal to the threshold is generated at the connection points P1 to P3 of the discharge blocks B1 to B3. This configuration has an advantage that the first transistor Q1 to the third transistor Q3 can be eliminated.

(6) In the third embodiment, by way of example, in the battery 20 of the 48-V system, the BM 50 is insulated from the high voltage-side circuit such as the secondary battery 31 and the resistance circuit 61 using the first photocoupler PC1 to the fourth photocoupler PC4 that are the optical insulation elements. The voltage class of the battery 20 is not limited to the 48-V system. For example, the present invention may be applied to a 12-V battery to insulate the BM 50 from the high voltage-side circuit such as the secondary battery 31 and the resistance circuit 61.

(7) The present invention is not limited to the starting of the engine of a four-wheel vehicle (such as an automobile). The present invention may be used for auxiliary equipment for the four-wheel vehicle, or used to start the engine of a two-wheel vehicle. The present invention may be applied to a discharge resistor mounted on a battery management device that drives an automated guided vehicle (AGV). The present invention may be applied to a discharge resistor of a battery management device mounted on an uninterruptible power supply (UPS). The present invention may be applied to a discharge resistor mounted on a battery management device that drives an electric vehicle (EV) or a plug-in hybrid vehicle (PHV). The battery that drives the EV and the PHV has a large capacity. For this reason, the large current flows through the discharge resistor, and the large heat is generated in the discharge resistor. When the large heat is generated, sometimes the discharge resistor fails due to repetition of thermal expansion and contraction. For example, there is a contact failure (solder crack) of the discharge resistor. Thus, it is particularly useful that the failure can be detected without stopping the discharge circuit when the present invention is used for the EV and the PHV. It does not matter whether the present invention is used for the application as long as the present invention is applied to the energy storage apparatus including the discharge resistor.

DESCRIPTION OF REFERENCE SIGNS

20 . . . battery
30 . . . assembled battery
31 . . . secondary battery
50 . . . BM (corresponding to the "determination unit" of the present invention)
60 . . . discharge circuit
61 . . . resistance circuit
B1 to B3 . . . resistance block
P1 to P3 . . . connection point
Q1 to Q3 . . . transistor (corresponding to the "detection element" of the present invention)
Q4 . . . transistor (corresponding to the "series switch" of the present invention)
Ra, Rb . . . discharge resistance

The invention claimed is:

1. A failure diagnostic device comprising:
a plurality of detection elements; and
a battery management device connected to a discharge circuit that discharges an energy storage device,
wherein:
the discharge circuit includes a resistance circuit including a plurality of resistance blocks connected in parallel,
each of the plurality of resistance blocks includes a plurality of discharge resistors that are each connected via a connection point in series,
the connection points of the plurality of resistance blocks are connected to each other by the plurality of detection elements, and
during discharge of the energy storage device, the battery management device diagnoses failure of the resistance circuit based on voltage or current at the connection point of the discharge resistors.

2. The failure diagnostic device according to claim 1, wherein:
the battery management device includes a determination unit;
the plurality of detection elements detect a voltage difference between resistance blocks at the connection point of the discharge resistors and output a detection signal; and
the determination unit determines whether the resistance circuit fails based on the detection signal output from the detection element.

3. The failure diagnostic device according to claim 2, wherein the plurality of detection elements are commonly connected to the determination unit.

4. The failure diagnostic device according to claim 2, wherein one or more of the plurality of detection elements is an optical insulation element that transmits the detection signal to the determination unit while being insulated from the resistance circuit.

5. The failure diagnostic device according to claim 4, wherein the energy storage device is for a battery of a 48-V system.

6. The failure diagnostic device according to claim 2, wherein:
the discharge circuit includes a series switch connected in series to the resistance circuit, and
the determination unit determines whether the series switch fails based on the voltage at the connection point of the discharge resistors.

7. The failure diagnostic device according to claim 1, wherein:
a plurality of the energy storage devices are provided in series, and
the discharge circuit is a balancer circuit that is provided corresponding to each of the plurality of energy storage devices to equalize the voltages of the plurality of energy storage devices.

8. The failure diagnostic device according to claim 1, wherein the plurality of detection elements is a plurality of transistors.

* * * * *